United States Patent
Kim et al.

(10) Patent No.: US 9,202,933 B2
(45) Date of Patent: Dec. 1, 2015

(54) FLASH MEMORY USING FRINGING EFFECTS AND ELECTROSTATIC SHIELDING

(75) Inventors: Tae Whan Kim, Seoul (KR); Joo Hyung You, Seoul (KR); Sung Ho Kim, Seoul (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 246 days.

(21) Appl. No.: 13/992,298

(22) PCT Filed: Dec. 5, 2011

(86) PCT No.: PCT/KR2011/009364
§ 371 (c)(1),
(2), (4) Date: Jun. 7, 2013

(87) PCT Pub. No.: WO2012/077951
PCT Pub. Date: Jun. 14, 2012

(65) Prior Publication Data
US 2013/0256782 A1    Oct. 3, 2013

(30) Foreign Application Priority Data
Dec. 8, 2010 (KR) .......... 10-2010-0125142

(51) Int. Cl.
*H01L 29/792* (2006.01)
*H01L 27/115* (2006.01)
*H01L 29/423* (2006.01)
*H01L 29/66* (2006.01)

(52) U.S. Cl.
CPC ........ *H01L 29/792* (2013.01); *H01L 27/11568* (2013.01); *H01L 29/4234* (2013.01); *H01L 29/66833* (2013.01)

(58) Field of Classification Search
CPC .............. H01L 29/792; H01L 29/7923; H01L 29/66833; H01L 29/4234; H01L 29/42344; H01L 29/42348; H01L 29/42352; H01L 27/11563; H01L 27/11568; H01L 27/11565; H01L 27/1157; H01L 27/11573; H01L 27/11575; H01L 27/11578
See application file for complete search history.

(56) References Cited

U.S. PATENT DOCUMENTS

| | | | |
|---|---|---|---|
| 2003/0218205 A1* | 11/2003 | Takamura | 257/315 |
| 2003/0235075 A1* | 12/2003 | Forbes | 365/177 |
| 2004/0228200 A1* | 11/2004 | Shibata et al. | 365/232 |
| 2007/0147118 A1 | 6/2007 | Pham et al. | |
| 2008/0057643 A1 | 3/2008 | Aritome | |
| 2008/0112226 A1 | 5/2008 | Mokhlesi | |
| 2008/0151631 A1* | 6/2008 | Hyun et al. | 365/185.18 |
| 2008/0160680 A1* | 7/2008 | Yuan | 438/129 |
| 2009/0045445 A1* | 2/2009 | Yang et al. | 257/299 |

(Continued)

FOREIGN PATENT DOCUMENTS

| | | |
|---|---|---|
| JP | 2010-3951 A | 1/2010 |
| KR | 1020070007256 A | 1/2007 |

(Continued)

*Primary Examiner* — Anthony Ho
*Assistant Examiner* — Samuel Lair
(74) *Attorney, Agent, or Firm* — Ladas & Parry LLP

(57) ABSTRACT

Disclosed is a flash memory using fringing effects and an electrostatic shielding function. A gap between adjacent gate stacks is controlled by fringing effects, and an operation of each of the gate stacks is electrostatically shielded by a gate electrode extending to a tunneling insulation layer. Thus, coupling between the adjacent gate stacks is minimized by electrostatic shielding.

10 Claims, 4 Drawing Sheets

(56) References Cited

U.S. PATENT DOCUMENTS

| | | | |
|---|---|---|---|
| 2009/0116287 A1* | 5/2009 | Ou et al. | 365/185.13 |
| 2010/0038698 A1* | 2/2010 | Lee | 257/324 |
| 2011/0044112 A1* | 2/2011 | Torii | 365/185.18 |
| 2012/0018794 A1* | 1/2012 | Lu et al. | 257/316 |
| 2013/0248967 A1* | 9/2013 | Ohba | 257/316 |

FOREIGN PATENT DOCUMENTS

| | | |
|---|---|---|
| KR | 1020090002484 A | 1/2009 |
| KR | 1020090088693 A | 8/2009 |
| KR | 10-0966265 B1 | 6/2010 |
| KR | 1020100081601 A | 7/2010 |

\* cited by examiner

FLASH MEMORY USING FRINGING EFFECTS AND ELECTROSTATIC SHIELDING

TECHNICAL FIELD

The present invention relates to a flash memory, and more specifically, to a flash memory configured to minimize coupling effect between adjacent cells.

BACKGROUND ART

Flash memories are representative non-volatile memories, and are divided into a NAND type and a NOR type. In particular, high integration of the flash memory is in progress, which is accomplished by scaling-down of cell transistors which form a main structure of the flash memory.

When the size of the cell transistor becomes small, the distance between cells may decrease. In particular, a coupling effect in a NAND-type flash memory in which adjacent cells are connected in a string structure may occur between the cells, which changes threshold voltages of the adjacent cells, thus resulting in degradation of reliability in operation of a memory device.

In addition, as the size of a cell transistor decreases, leakage current of a silicon substrate may increase due to a short channel effect.

To solve this problem, a technology of controlling a channel between adjacent cells using a fringing field under a gate bias has been introduced recently, instead of conventionally performing high-concentration doping in source and drain areas of each cell in a string structure of a NAND flash memory. Here, the fringing field may refer to an electric field leaked out of an edge of a strip line. That is, the channel between the adjacent cells may be controlled using the electric field leaked by the gate bias.

However, in the technology of using the fringing field, there is a problem in that the channel has high resistance since the electric field applied to the channel part is not strong enough to form the channel fully. Accordingly, when an operation voltage, such as a read voltage, is applied, it is difficult to obtain a desired amount of current. Therefore, a normal technology of using the fringing field may have a limitation in performing normal program operation, since operation characteristics of a device are degraded and the amount of electrons injected into a trapping layer is small due to a low coupling ratio, compared to the conventional device.

DISCLOSURE

Technical Problem

The present invention is directed to provide a flash memory capable of minimizing coupling between adjacent gates, using fringing effects.

Technical Solution

In accordance with an aspect of the present invention, a flash memory includes a tunneling insulating layer formed on a substrate, a first gate stack formed on the tunneling insulating layer, and a second gate stack spaced apart from the first gate stack by an inter-gate insulating layer and formed on the tunneling insulating layer. Each of the first and second gate stacks includes a gate electrode extending to a top of the tunneling insulating layer.

In accordance with another aspect of the present invention, a flash memory includes a tunneling insulating layer formed on a substrate, a first gate stack formed on the tunneling insulating layer, and a second gate stack formed on the tunneling insulating layer, and adjacent to the first gate stack. A channel area disposed in a region between the first gate stack and the second gate stack is controlled by fringing effects, and each of the gate stacks is out of cross-coupling, by electrostatic shielding.

Advantageous Effects

According to the present invention, a gate electrode is formed to extend to a side surface of a charge-trapping layer. Therefore, a channel area corresponding to a region between gate stacks may be effectively controlled by a fringing field, which is an electric field applied from an ending part of the gate electrode. In addition, since electrostatic shielding occurs due to the gate electrode composed of a conductive material, coupling between adjacent gate stacks may be minimized.

BEST MODE FOR CARRYING OUT THE INVENTION

Figure 1:
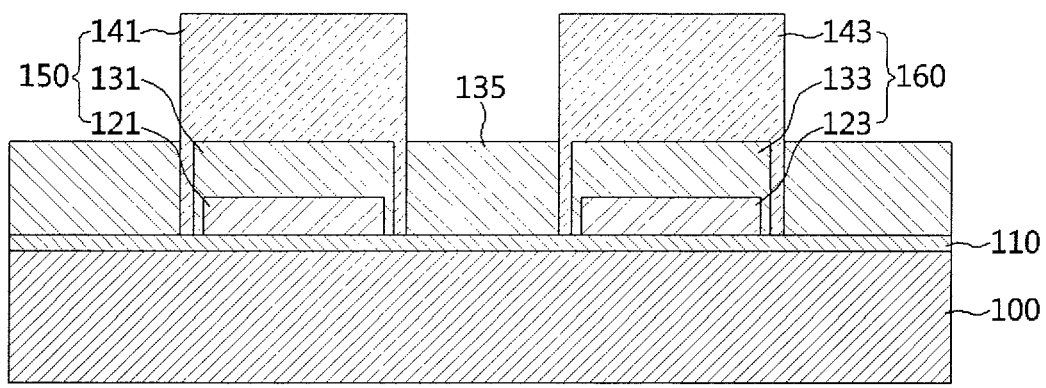
FIG. 1 is a cross-sectional view of a flash memory in accordance with an embodiment of the present invention.

Various embodiments will now be described more fully with reference to the accompanying drawings in which some embodiments are shown. These present inventions may, however, be embodied in different forms and should not be construed as limited to the embodiments set forth herein. Rather, these embodiments are provided so that this disclosure is thorough and complete and fully conveys the present invention to those skilled in the art. In the drawings, the sizes and relative sizes of layers and regions may be exaggerated for clarity.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Hereinafter, embodiments of the present invention will be fully described with reference to the accompanying drawings.

Embodiments

FIG. 1 is a cross-sectional view of a flash memory in accordance with an embodiment of the present invention.

Referring to FIG. 1, a first gate stack 150 and a second gate stack 160 may be formed on a substrate 100. The first gate stack 150 and the second gate stack 160 may be formed adjacent to each other, on a tunneling insulating layer 110. The tunneling insulating layer 110 may be formed through a thermal-oxidation process, and tunneling of charges may occur therein. Accordingly, the tunneling insulating layer 110 may be formed of an oxide layer of an appropriate thickness, depending on applied voltages.

The first gate stack 150 may be composed of a first charge-trapping layer 121, a first blocking insulating layer 131, and a first gate electrode 141.

The first charge-trapping layer 121 may be formed of stoichiometric silicon nitride ($Si_3N_4$) or non-stoichiometric silicon nitride ($Si_xN_y$). Otherwise, the first charge-trapping layer 121 may be formed of a laminated structure of stoichiometric silicon nitride ($Si_3N_4$) and non-stoichiometric silicon nitride ($Si_xN_y$). In the case of non-stoichiometric silicon nitride ($Si_xN_y$), silicon may have a variety of configuration and may have more mole fraction x than that of nitrogen.

A first blocking insulating layer 131 may be arranged on upper and side surfaces of the first charge-trapping layer 121. That is, the first blocking insulating layer 131 may be formed to surround the upper and side surfaces of the first charge-trapping layer 121. The first blocking insulating layer 131 may prevent charges trapped in the first charge-trapping layer 121 from moving to the first gate electrode 141. Accordingly, the first blocking insulating layer 131 may be formed of a silicon oxide layer, and preferably formed of a high-k material. Accordingly, the first blocking insulating layer 131 may include $Al_2O_3$, $HfO_2$, $TiO_2$, $La_2O_5$, $BaZrO_3$, $Ta_2O_5$, $ZrO_2$, $Gd_2O_3$, or $Y_2O_3$.

A first gate electrode 141 may be arranged on the upper and side surfaces of the first charge-trapping layer 121. The first gate electrode 141 may be conductive, and composed of doped poly-silicon or a metal material. When the first gate electrode 141 is composed of a metal material, TiN, TaN, or W may be included. The first gate electrode 141 may be formed to surround the upper and side surfaces of the first charge-trapping layer 121 and the first blocking insulating layer 131. In addition, the first gate electrode 141 may be formed on the tunneling insulating layer 110 and surround the side surface of the first blocking insulating layer 131. For example, the first gate electrode 141 may be in direct contact with the tunneling insulating layer 110, and formed to penetrate to a predetermined area of the first blocking insulating layer 131.

The second gate stack 160 may be composed of a second charge-trapping layer 123, a second blocking insulating layer 133, and a second gate electrode 143. Each element composing the second gate stack 160 may have substantially the same material and shape as each element composing the first gate stack 150. In addition, the first gate stack 150 and the second gate stack 160 may be separated by an inter-gate insulating layer 135. The inter-gate insulating layer 135 may have the same material as the first blocking insulating layer 131 and the second blocking insulating layer 133.

FIGS. 2 to 6 are cross-sectional views for describing a method of fabricating a flash memory illustrated in FIG. 1, in accordance with an embodiment of the present invention.

Figure 2:
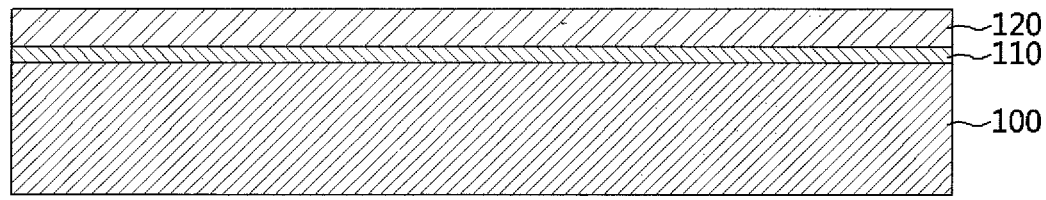
FIGS. 2 to 6 are cross-sectional views for describing a method of fabricating a flash memory illustrated in FIG. 1.

Referring to FIG. 2, a tunneling insulating layer 110 and a charge-trapping layer 120 may be sequentially formed on a substrate 100. The tunneling insulating layer 110 may be preferably formed by a thermal oxidation process, and the charge-trapping layer 120 may be formed by a common deposition process. In particular, the charge-trapping layer 120 may be composed of the same material as the first charge-trapping layer 121 and the second charge-trapping layer 123 illustrated in FIG. 1.

Figure 3:
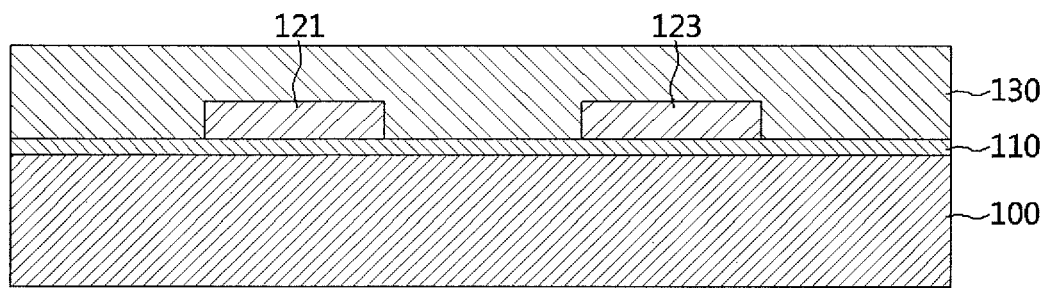

Referring to FIG. 3, the charge-trapping layer 120 illustrated in FIG. 2 may be selectively etched to form a first charge-trapping layer 121 and a second charge-trapping layer 123. First, a photoresist may be coated on the charge-trapping layer 120 illustrated in FIG. 2, and a photoresist pattern may be formed using a common photolithography process. The charge-trapping layer 120 may be etched using the photoresist pattern as an etch mask until the tunneling insulating layer 110 therebelow is exposed, to form the first charge-trapping layer 121 and the second charge-trapping layer 123.

Next, a blocking insulating layer 130 may be formed on the first charge-trapping layer 121 and the second charge-trapping layer 123 using a common deposition method. The formed blocking insulating layer 130 may bury the tunneling insulating layer 110, the first charge-trapping layer 121, and the second charge-trapping layer 123 which are exposed by the etch process. In addition, the blocking insulating layer 130 may have the same material as the first blocking insulating layer 131 and the second blocking insulating layer 133, as described in FIG. 1.

Figure 4:
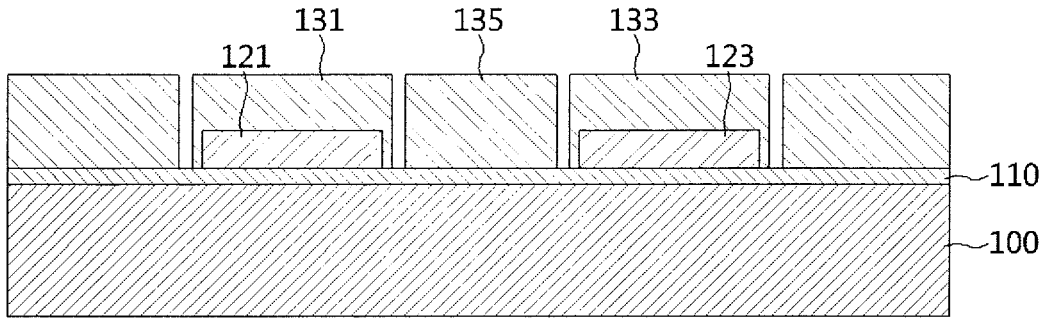

Referring to FIG. 4, the blocking insulating layer 130 illustrated in FIG. 3 may be selectively etched using a common photolithography process. A part of the blocking insulating layer 130 may be etched by the selective etch process, and a part of the tunneling insulating layer 110 therebelow may be exposed. Otherwise, the tunneling insulating layer 110 may be partly etched by the selective etch process, and thereby, the tunneling insulating layer 110 may be partly removed or partly remain in an etch area. Further, a part of the blocking insulating layer 130 disposed on the tunneling insulating layer 110 may remain in the etch process of the etch area.

A first blocking insulating layer 131, a second blocking insulating layer 133, and an inter-gate insulating layer 135 may be defined by the selective etch process of the blocking insulating layer 130. The first blocking insulating layer 131 may be formed to surround upper and side surfaces of the first charge-trapping layer 121, and the second blocking insulating layer 133 may be formed to surround upper and side surfaces of the second charge-trapping layer 123. In addition, the inter-gate insulating layer 135 may be arranged between the first blocking insulating layer 131 and the second blocking insulating layer 133, and block each gate structure.

Figure 5:
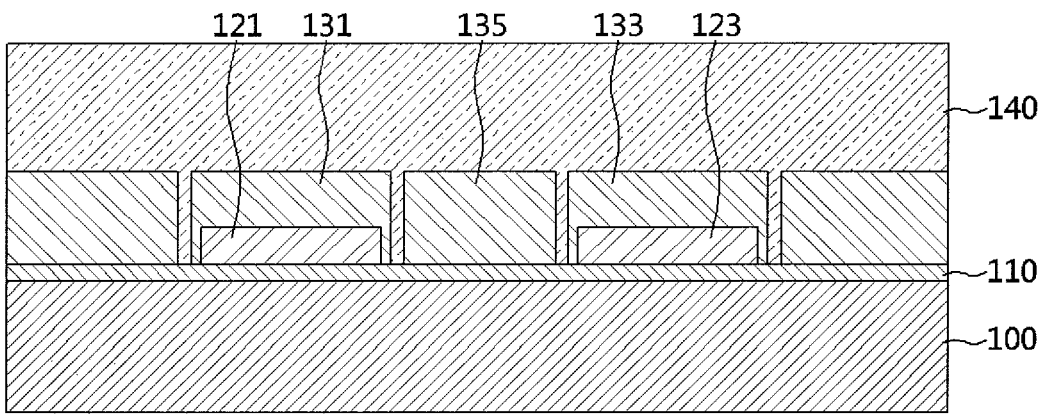

Referring to FIG. 5, an electrode layer 140 may be formed on the structure illustrated in FIG. 4. The electrode layer 140 may have the same material as the gate electrodes 141 and 143 illustrated in FIG. 1. In addition, the electrode layer 140 may be formed by a common method of forming an inorganic material or a metal material. The electrode layer 140 may be formed to fill an area etched toward the tunneling insulating layer 110 by the etch process described in FIG. 4. That is, the electrode layer 140 may be formed to fill a space between the first blocking insulating layer 131 and the inter-gate insulating layer 135, and a space between the second blocking insulating layer 133 and the inter-gate insulating layer 135.

Figure 6:
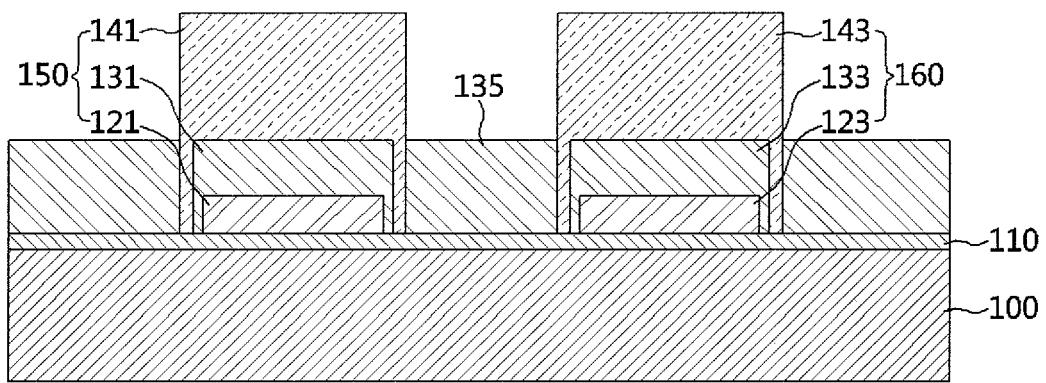

Referring to FIG. 6, a photoresist pattern may be formed on the electrode layer 140 illustrated in FIG. 5, using a common photolithography process. Next, an etch process may be performed using the photoresist pattern as an etch mask. The etch process may be selectively performed on a part of the formed electrode layer 140.

Accordingly, a surface of the inter-gate insulating layer 135 may be exposed. A first gate electrode 141 may be formed on the first blocking insulating layer 131, and a second gate electrode 143 may be formed on the second blocking insulating layer 133.

Figure 7:
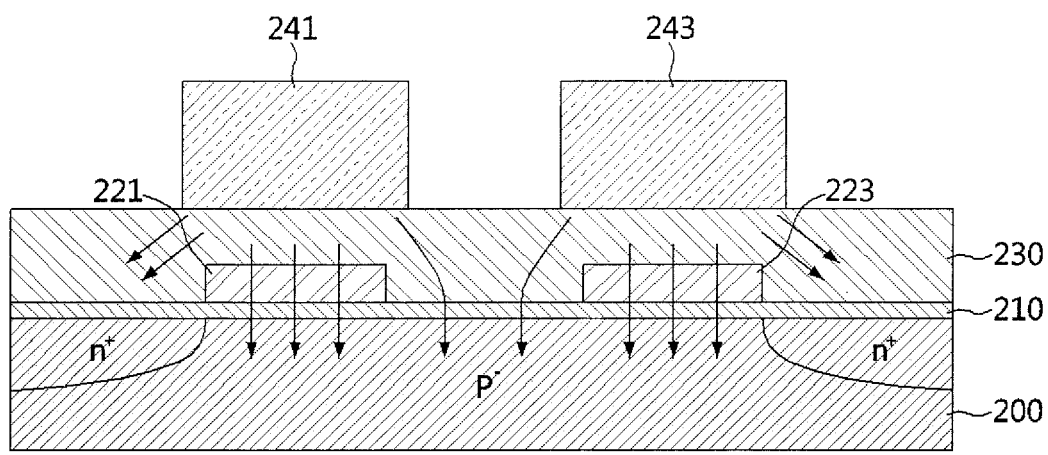
FIG. 7 is a conceptual diagram showing an electric field applied to a cell transistor, when a gate electrode does not extend to a side surface of a charge-trapping layer in accordance with a conventional technology.

FIG. 7 is a conceptual diagram showing an electric field applied to a cell transistor, when a gate electrode does not extend to a side surface of a charge-trapping layer in accordance with the conventional technology.

Referring to FIG. 7, a tunneling insulating layer 210 which is formed of silicon oxide and has a thickness of 4 nanometers may be provided on a substrate 200. In addition, charge-trapping layers 221 and 223 composed of silicon nitride may be arranged thereon. The thickness of the charge-trapping layers 221 and 223 may be 5 nanometers. In particular, the width of the charge-trapping layers 221 and 223 may be 42 nanometers. The distance between the charge-trapping layers 221 and 223 may be 14 nanometers.

In addition, a blocking insulating layer 230 may be formed on the charge-trapping layers 221 and 223. The blocking insulating layer 230 may be formed of silicon oxide. The thickness of the blocking insulating layer 230 may be 6 nanometers. Gate electrodes 241 and 243 formed on the blocking insulating layer 230 may be formed of an aluminum metal material.

When a voltage is applied to a channel area under the above described conditions, a weak electric field may be applied to a channel area between adjacent charge-trapping layers 221 and 223, which is due to a phenomenon in which the electric field is applied across a relatively long distance since the gate electrodes 241 and 243 are formed on the blocking insulating layer 230.

Figure 8:
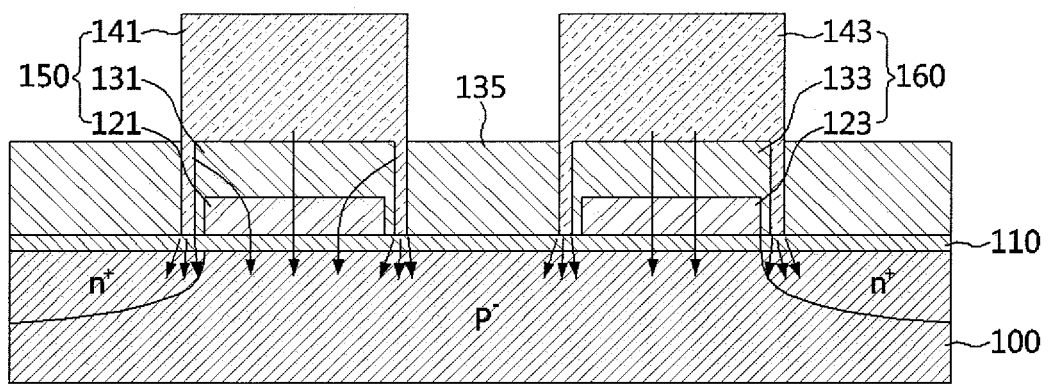
FIG. 8 is a conceptual diagram showing an electric field applied to a cell transistor when a gate electrode extends to a side surface of a charge-trapping layer in accordance with an embodiment of the present invention.

FIG. 8 is a conceptual diagram showing an electric field applied to a cell transistor, when a gate electrode extends to a side surface of a charge-trapping layer in accordance with a preferred embodiment of the present invention.

Referring to FIG. 8, the flash memory illustrated in FIG. 1 in accordance with an embodiment of the inventive concept may be provided. In particular, the gate electrodes 141 and 143 may be formed to extend to side surfaces of the charge-trapping layers 121 and 123, respectively. For example, the first gate electrode 141 and the second gate electrode 143 may be respectively arranged to extend to side surfaces of the first charge-trapping layer 121 and the second charge-trapping layer 123, and to a top of the tunneling insulating layer 110.

The thickness of the tunneling insulating layer 110 illustrated in FIG. 8 may be 4 nanometers, and the thickness of the first charge-trapping layer 121 and the second charge-trapping layer 123 may be 5 nanometers. In addition, the thickness of the first blocking insulating layer 131 and the second blocking insulating layer 133 may be 6 nanometers. The first gate electrode 141 and second gate electrode 143 may be formed of an aluminum metal material. In addition, the tunneling insulating layer 110, and the first and second charge-trapping layers 121 and 123, and the first and second blocking insulating layers 131 and 133 may be respectively formed of the same materials as described in FIG. 7.

In addition, the distance between the first charge-trapping layer 121 and the second charge-trapping layer 123 may be 14 nanometers. The width of ending parts of the gate electrodes 141 and 143 may be 2 nanometers when the gate electrodes 141 and 143 respectively extend to side surfaces of the charge-trapping layers 121 and 123.

An electric field may be concentrated on the ending parts of the first gate electrode 141 and the second gate electrode 143 extending to the top of the tunneling insulating layer 110. In addition, due to the fringing effect, the electric field may be strongly concentrated on the region between the gate stacks 150 and 160 from the ending parts of the first and second gate electrodes 141 and 143. Accordingly, a sufficiently strong electric field may be applied to a channel area during program operation, and a channel may be easily formed in the region between the gate stacks 150 and 160 during read operation.

In addition, when a specific bias is applied to the gate stacks 150 and 160, a coupling effect occurring between the adjacent gate stacks 150 and 160 may be reduced due to a shielding effect at the gate electrodes 141 and 143.

Figure 9:
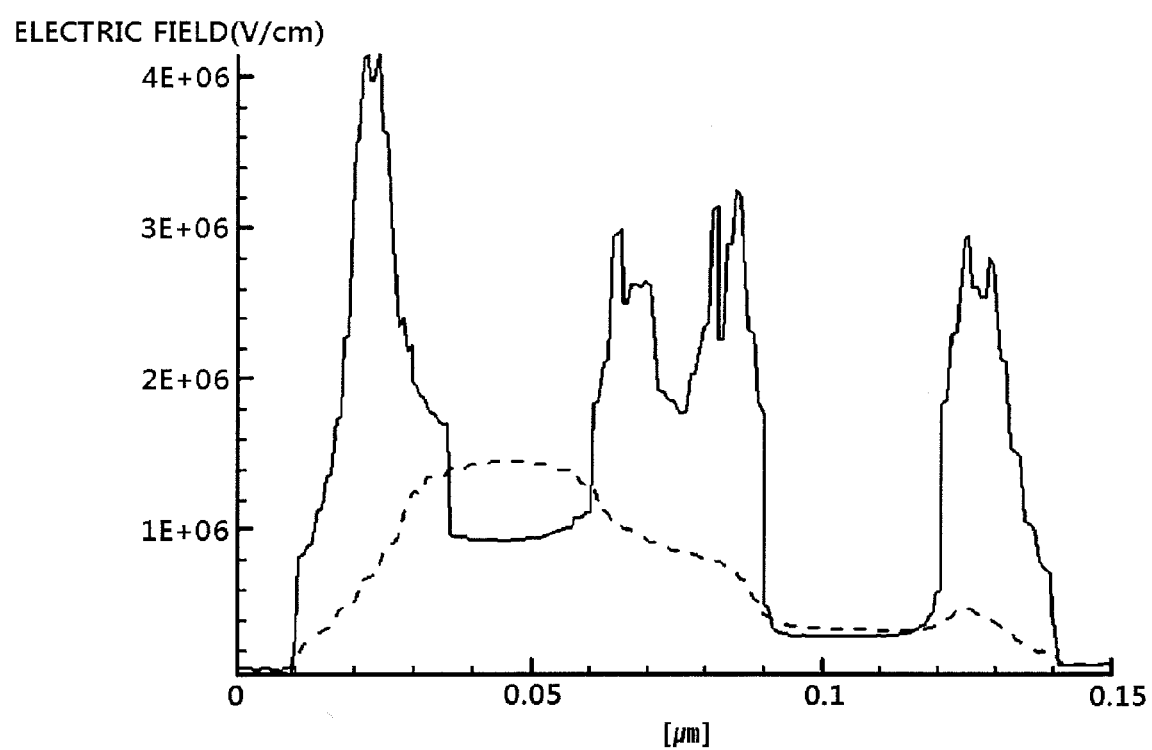
FIG. 9 is a graph describing electric field characteristics of the flash memories illustrated in FIGS. 7 and 8, in accordance with embodiments of the present invention.

FIG. 9 is a graph illustrating electric field characteristics of the flash memories described in FIGS. 7 and 8.

Referring to FIG. 9, the flash memories described in FIGS. 7 and 8 are in an erase state. In addition, the dotted line represents electric field intensities by areas of the flash memory described in FIG. 7, and the solid line represents electric field intensities by areas of the flash memory described in FIG. 8.

Measurement conditions are set in such a way that the first charge-trapping layers 121 and 221 are in an erase state, the second charge-trapping layers 121 and 221 are in a program state, 5 V is applied to the gate electrodes 141, 143, 241, and 243 as a pass voltage, and electric field intensities at channel areas are measured.

First, electric field intensities of the flash memory illustrated in FIG. 7 will be described. High electric field intensity is shown below the first charge-trapping layer 221 by the erase operation, which means that charges are concentrated below the first charge-trapping layer 221 by the erase operation. In addition, the electric field intensity decreases at a distance of more than 0.06 micrometers, and a significantly low electric field intensity is shown at a distance of more than 0.9 micrometers. This is caused by the program operation of the second charge-trapping layer 223. That is, since charges disposed below the second charge-trapping layer 223 are sparse because they have moved to the second charge-trapping layer 223, the electric field intensity is low.

In particular, in the region between the first charge-trapping layer 221 and the second charge-trapping layer 223, charges are linearly distributed due to the coupling between both channels. This shows a state in which the charges are unstably distributed between the charge-trapping layers 221 and 223.

In the flash memory illustrated in FIG. 8, a relatively large amount of charges is distributed below the first charge-trapping layer 121 having a thickness of 0.05 micrometers by the erase operation. In addition, significantly high charges are distributed at the region outside of the first charge-trapping layer 121. This is due to a voltage applied to the region between the first gate stack 150 and the second gate stack 160 during the previous erase operation, etc. by the ending part of the gate electrodes 141 and 143 extending to the tunneling insulating layer 110. However, since influence of the electric field is shielded at the region between the gate stacks 150 and 160 by the gate electrodes 141 and 143, influence of charges distributed in the region between the adjacent gate stacks 150 and 160 may be almost negligible. This shows that there is little coupling between the adjacent gate stacks 150 and 160.

Next, the electric field intensity decreases at a channel area below the second gate stack 160 in the program state, since charges below the second gate stack 160 decrease due to the program operation of the second gate stack 160.

In particular, the electric field at a channel area between the first gate stack 150 and the second gate stack 160 may have non-linear characteristics, compared to the channel area below the adjacent gate stacks 150 and 160. This shows that the influence of an electric field or bias by the adjacent gate stacks 150 and 160 is shielded. That is, the coupling by the adjacent gate stacks may be blocked due to electrostatic shielding of the gate electrode which is a conductive material.

Coupling between gate stacks in a flash memory may be minimized through the previously described structure. In addition, through the previously described structure, selectivity with respect to at least two gate stacks may be improved, and statuses of channel areas below the gate stacks may be effectively controlled.

The invention claimed is:

1. A flash memory, comprising:
    a tunneling insulating layer formed on a substrate;
    a first gate stack formed on the tunneling insulating layer; and
    a second gate stack spaced apart from the first gate stack by an inter-gate insulating layer and formed on the tunneling insulating layer,
    wherein each of the first and second gate stacks includes a gate electrode extending to a top of the tunneling insulating layer,
    wherein the first gate stack comprises:
        a first charge-trapping layer formed on the tunneling insulating layer;
        a first blocking insulating layer formed to surround side and upper surfaces of the first charge-trapping layer; and
        a first gate electrode formed to surround side and upper surfaces of the first blocking insulating layer.

2. The flash memory of claim 1, wherein the first gate electrode extends to a side surface of the first charge-trapping layer and shields the first charge-trapping layer.

3. The flash memory of claim 1, wherein the first gate electrode controls a channel area disposed in a region between the first gate stack and the second gate stack using a fringing effect.

4. The flash memory of claim 1, wherein the second gate stack comprises:
    a second charge-trapping layer formed on the tunneling insulating layer;
    a second blocking insulating layer formed to surround side and upper surfaces of the second charge-trapping layer; and
    a second gate electrode formed to surround side and upper surfaces of the second blocking insulating layer.

5. A flash memory, comprising:
    a tunneling insulating layer formed on a substrate;
    a first gate stack formed on the tunneling insulating layer; and
    a second gate stack spaced apart from the first gate stack by an inter-gate insulating layer and formed on the tunneling insulating layer,
    wherein each of the first and second gate stacks includes a gate electrode extending to a top of the tunneling insulating layer,
    wherein the second gate stack comprises:
        a second charge-trapping layer formed on the tunneling insulating layer;
        a second blocking insulating layer formed to surround side and upper surfaces of the second charge-trapping layer; and
        a second gate electrode formed to surround side and upper surfaces of the second blocking insulating layer.

6. The flash memory of claim 5, wherein the second gate electrode extends to a side surface of the second charge-trapping layer and shields the second charge-trapping layer.

7. The flash memory of claim 4, wherein the second gate electrode extends to a side surface of the second charge-trapping layer and shields the second charge-trapping layer.

8. The flash memory of claim 5, wherein the first gate stack comprises:
    a first charge-trapping layer formed on the tunneling insulating layer;
    a first blocking insulating layer formed to surround side and upper surfaces of the first charge-trapping layer; and
    a first gate electrode formed to surround side and upper surfaces of the first blocking insulating layer.

9. The flash memory of claim 8, wherein the first gate electrode extends to a side surface of the first charge-trapping layer and shields the first charge-trapping layer.

10. The flash memory of claim 8, wherein the first gate electrode controls a channel area disposed in a region between the first gate stack and the second gate stack using a fringing effect.

* * * * *